United States Patent [19]
Fujita

[11] Patent Number: 5,578,509
[45] Date of Patent: Nov. 26, 1996

[54] METHOD OF MAKING A FIELD EFFECT TRANSISTOR

[75] Inventor: Koichi Fujita, Itami, Japan

[73] Assignee: Mitsubishi Denki Kabushiki Kaisha, Tokyo, Japan

[21] Appl. No.: 446,298

[22] Filed: May 22, 1995

Related U.S. Application Data

[62] Division of Ser. No. 230,226, Apr. 20, 1994, Pat. No. 5,451,807.

[30] Foreign Application Priority Data

Apr. 23, 1993 [JP] Japan ..................... 5-096408

[51] Int. Cl.$^6$ ..................... H01L 21/266; H01L 21/335
[52] U.S. Cl. ..................... 437/35; 437/41; 437/44; 437/40
[58] Field of Search ..................... 437/35, 40 DM, 437/40 AS, 41 DM, 41 AS, 44

[56] References Cited

U.S. PATENT DOCUMENTS

| | | | |
|---|---|---|---|
| H986 | 11/1991 | Codella et al. ..................... | 437/41 AS |
| 4,173,818 | 11/1979 | Bassous et al. ..................... | 437/44 |
| 4,442,589 | 4/1984 | Doo et al. ..................... | 437/41 DM |
| 4,929,991 | 5/1990 | Blanchard . | |
| 4,956,308 | 9/1990 | Griffin et al. ..................... | 437/44 |
| 5,153,683 | 10/1992 | Noda . | |
| 5,155,563 | 10/1992 | Davies et al. . | |
| 5,210,044 | 5/1993 | Yoshikawa ..................... | 437/44 |
| 5,216,272 | 6/1993 | Kubokoya et al. ..................... | 257/409 |
| 5,304,827 | 4/1994 | Malhi et al. ..................... | 257/262 |
| 5,306,656 | 4/1994 | Williams et al. ..................... | 437/40 AS |
| 5,364,807 | 11/1994 | Hwang ..................... | 437/44 |
| 5,371,394 | 12/1994 | Ma et al. ..................... | 437/44 |
| 5,376,566 | 12/1994 | Gonzalez ..................... | 437/35 |
| 5,384,479 | 1/1995 | Taniguchi ..................... | 257/412 |

FOREIGN PATENT DOCUMENTS

| | | |
|---|---|---|
| 0003231 | 8/1979 | European Pat. Off. . |
| 0402296 | 12/1990 | European Pat. Off. . |
| 0514060 | 11/1992 | European Pat. Off. . |
| 53-66181 | 6/1978 | Japan ..................... 437/41 AS |
| 56-56674 | 5/1981 | Japan ..................... 437/40 AS |
| 58-93279 | 6/1983 | Japan ..................... 437/44 |
| 58-194367 | 11/1983 | Japan . |
| 63-40374 | 2/1988 | Japan ..................... 437/44 |
| 1-5069 | 1/1989 | Japan ..................... 437/40 AS |

OTHER PUBLICATIONS

T. N. Buti, et al., IEEE Trans. Electron Dev., 38(8)(1991) 1757 "Assymetrical Halo Source Gold Drain . . . n–MOSFET . . . ".

E. Bassous, et al., IBM Tech. Discl. Bulletin, 21(12)(1979) 5035 ". . . IGFET Structures with . . . Submicron Channel Lengths".

S. N. Chakravarti, et al., IBM Tech. Discl. Bulletin, 19(4)(1976) 1162 "Double Diffused MOS FET".

*Primary Examiner*—Charles L. Bowers, Jr.
*Assistant Examiner*—Leon Radomsky
*Attorney, Agent, or Firm*—Leydig, Voit & Mayer

[57] ABSTRACT

A method for producing a field effect transistor including source and drain regions produced by implanting a dopant impurity employing a gate electrode as a mask includes producing a gate electrode at a region on a first conductivity type semiconductor substrate; implanting a dopant impurity producing a second conductivity type in the substrate employing the gate electrode as a mask, thereby producing source and drain regions having a first dopant impurity concentration; producing a photoresist pattern on the substrate covering a drain electrode side of the substrate and having an aperture at a source electrode side of the substrate on the opposite side of the gate electrode from the drain electrode side and implanting a dopant impurity producing the second conductivity type in the substrate employing the photoresist pattern as a mask, thereby converting the source region from a first dopant impurity concentration to a second, high dopant impurity concentration; and diagonally rotatingly implanting in the substrate a dopant impurity producing the first conductivity type employing the photoresist pattern as a mask, thereby producing a first conductivity type region with a higher dopant impurity concentration than the substrate that surrounds the source region.

4 Claims, 9 Drawing Sheets

METHOD OF MAKING A FIELD EFFECT TRANSISTOR

This disclosure is a division of application Ser. No. 08/230,226, filed Apr. 20, 1994, now U.S. Pat. No. 5,451, 807.

FIELD OF THE INVENTION

The present invention relates to a field effect transistor and a production method thereof and, more particularly, to techniques for realizing high frequency, low voltage operation and increased breakdown voltage in a metal oxide semiconductor field effect transistor (hereinafter referred to as a MOSFET).

BACKGROUND OF THE INVENTION

Figure 9:
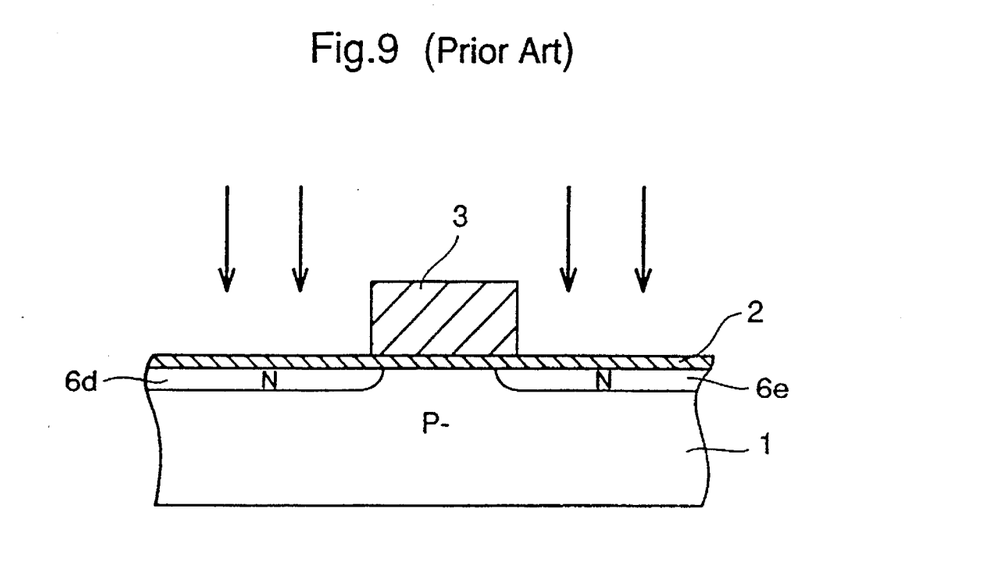
FIG. 9 is a schematic cross-sectional view illustrating a method of producing a prior art MOSFET.

FIG. 9 is a cross-sectional view of a prior art process for producing an N channel MOSFET. In the figure, reference numeral 1 designates a P(P⁻)-type semiconductor substrate, reference numeral 2 designates a gate oxide film disposed on the substrate 1, and reference numeral 3 designates a gate electrode comprising a refractory metal or polycrystalline silicon disposed on the gate oxide film 2. Reference numerals 6d and 6e respectively designate a source-side N-type region and a drain-side N-type region, both produced by implanting a dopant impurity, such as phosphorus or arsenic, employing the gate electrode 3 as a mask.

Figures 11A, 11B:
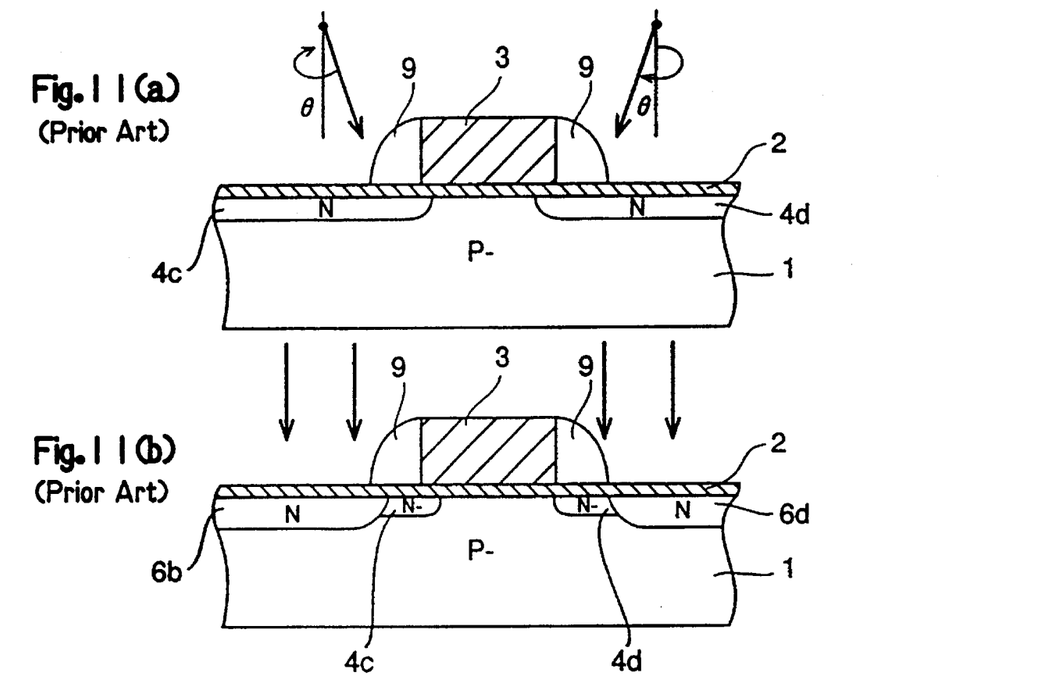
FIGS. 11(a) and 11(b) illustrate a method of producing another prior art MOSFET.
Figure 12:
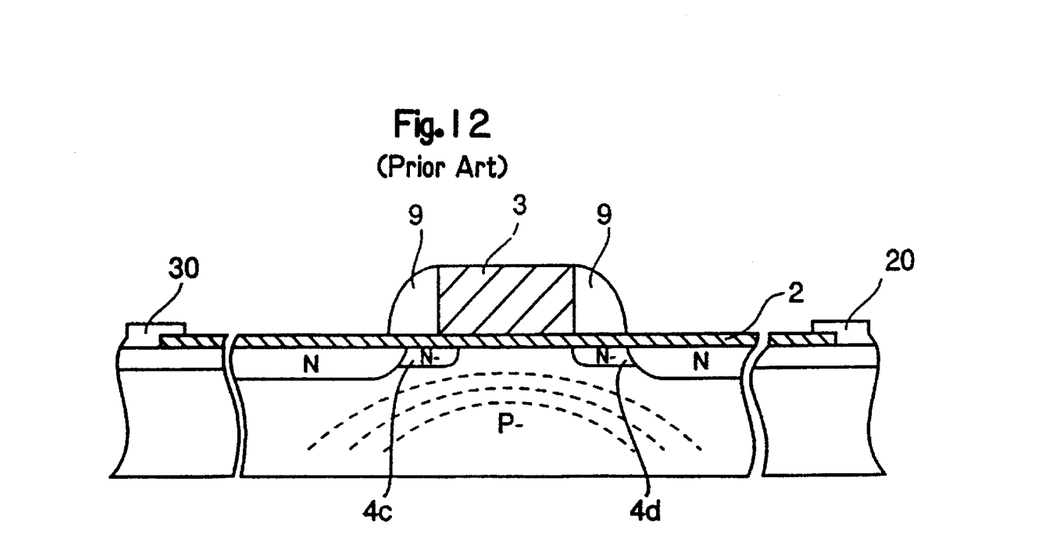
FIG. 12 is a diagram for explaining the operation of the prior art MOSFET described above.

FIGS. 11(a) and 11(b) are cross-sectional views of a prior art process for producing a lightly doped drain (hereinafter referred to as LDD) MOSFET that has been employed for suppressing variations in threshold voltage and reductions in the breakdown voltage in a MOSFET having a shortened gate length. In FIG. 11(a), reference numerals 9 designate side walls produced at both sides of the gate electrode 3 by, after processing the gate electrode 3, producing an oxide film on the entire surface of the substrate 1 and removing this film by anisotropic etching. Reference numerals 4c and 4d respectively designate a source-side N⁻-type region and a drain-side N⁻-type region, both produced by rotational implantation at an inclination angle, of a dopant impurity, such as phosphorus or arsenic, employing the gate electrode 3 and the side walls 9 as a mask. Reference numerals 6b and 6d respectively designate a source-side N-type region and a drain-side N-type region, both produced by implanting a dopant impurity, such as phosphorus or arsenic, with a higher concentration than the source-side N⁻-type region 4c and the drain-side N⁻-type region 4d, employing the gate electrode 3 and the side walls 9 as a mask.

In FIG. 9, the gate oxide film 2 on the P-type semiconductor substrate 1 is several tens of nanometers thick and is produced by thermal oxidation of the surface of the substrate 1. A refractory metal film or a polycrystalline silicon film several hundred nanometers thick is produced on the entire upper surface. The gate electrode 3 has an approximately 1 μm gate length. Next, the source-side N-type region 6d and the drain-side N-type region 6e are produced by implanting a dopant impurity, such as phosphorus or arsenic, employing the gate electrode 3 as a mask. Thereafter, the structure is annealed, completing all production processes.

When a positive voltage is applied to the drain electrode 20, the source electrode 30 is grounded, and a positive voltage is applied to the gate electrode 3, the P⁻-type semiconductor substrate 1 directly below the gate electrode 2 is inverted to N-type and the device operates as a MOSFET. When a reverse direction voltage is applied between the drain electrode 20 and the source electrode 30, the highest electric field is the drain-side N-type region 6e directly below the gate electrode 3 and can produce an avalanche breakdown. When the dopant impurity concentration of the P⁻-type semiconductor substrate 1 is lower than the dopant impurity concentration of the drain-side N-type region 6e, the depletion region from the drain-side N-type region 6e reaches the source-side N-type region 6d, causing punch-through breakdown. The threshold voltage applied to the gate electrode 3 is determined by the dopant impurity concentration of the P⁻-type semiconductor substrate 1 and the thickness of the gate oxide film 2.

Figure 10:
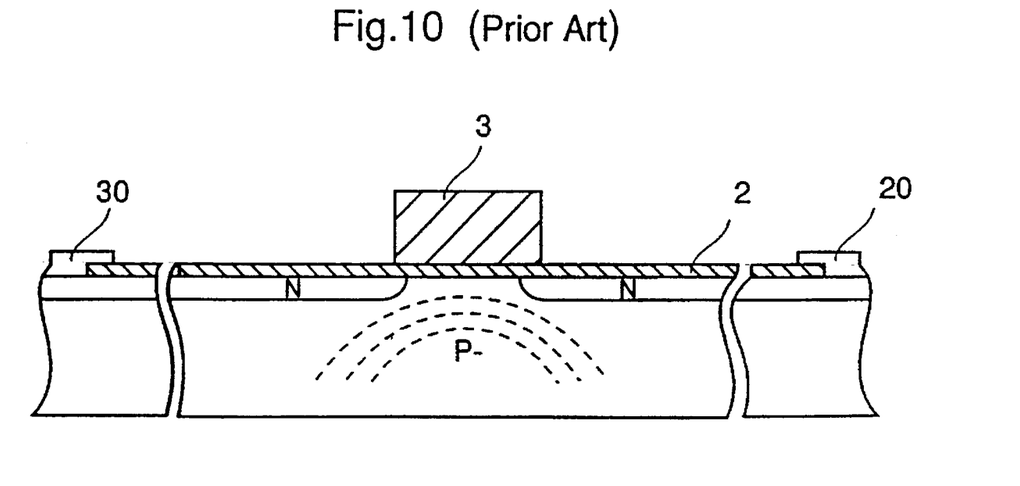
FIG. 10 is a diagram for explaining the operation of the MOSFET described above.

In the structure of FIG. 10, when the length of the gate electrode 3 is no more than 1 μm, avalanche breakdown and punch-through breakdown become significant so that no MOSFET having a practical breakdown voltage can be made. Furthermore, there are equipotential surfaces curving directly below the gate electrode 3, as shown by broken lines in FIG. 10, resulting in a reduction in the threshold voltage. The equipotential surfaces result in unstable switching so that the rated operation is difficult to realize and high frequency isolation characteristics deteriorate. While the above description pertains to an N-type MOSFET, in a P-type MOSFET, the rated operation is also difficult to realize due to a rise in the threshold voltage that causes unstable switching.

One prior art solution to this problem is the so-called LDD structure. As shown in FIG. 11(a), after processing the gate electrode 3, an oxide film (not shown) is deposited on the entire surface of the semiconductor substrate. Portions of the oxide film at both sides of the gate electrode 3 remain after anisotropic etching because the thicknesses of these portions of the oxide film are larger than the oxide film located at flat portions of the substrate spaced from the gate electrode 4. These remaining portions at both sides of the gate electrode are employed as side walls 9. After producing the side walls 9, the source-side N⁻-type region 4c and the drain-side N⁻-type region 4d are produced by rotational ion implantation of a dopant impurity, such as phosphorus, at an inclination angle and employing the gate electrode 3 and the side walls 9 as a mask.

Subsequently, as shown in FIG. 11(b), the source-side N-type region 6b and the drain-side N-type region 6d are produced by rotational ion implantation with an inclination angle of 0° or 7° between the substrate surface and the direction of incidence of a dopant impurity, such as phosphorus or arsenic. The implantation produces a higher dopant impurity concentration than in the source-side N⁻-type region 4c and in the drain-side N⁻-type region 4d, produced as described above, and employs the gate electrode 3 and the side walls 9 as a mask.

When a positive voltage is applied to the drain electrode 20, which is produced in a subsequent production process not shown in FIG. 11(a), with the source electrode 30 grounded, the electric field is relaxed by the source-side N⁻-type region 4c directly below the gate electrode 3. Therefore, avalanche breakdown and punch-through are suppressed. In addition, the radius of curvature of the equipotential electric field surface directly below the gate electrode 3 when a reverse direction voltage is applied is increased by the source-side N⁻-type region 4c and the drain-side N⁻-type region 4d, reducing the threshold voltage for a particular gate voltage.

Because the prior art field effect transistor is structured as described above, a reduction in the breakdown voltage accompanying the shortening of the gate length is unavoidable, resulting in difficulty in suppressing a reduction in the threshold voltage. When the LDD structure is adopted as a solution to these problems, a considerable improvement is obtained in a general IC circuit but, when an LDD structure is employed in a circuit operating at high power and a high frequency, it is difficult to obtain a satisfactory improvement. While it is known that reductions in breakdown voltage and threshold voltage are suppressed by increasing the substrate dopant impurity concentration, this method causes a reduction in the mobility of electrons in a channel directly below the gate electrode, resulting in difficulty in realizing high speed operation.

Japanese Published Patent Application Sho. No. 62-95873 discloses a MOSFET having a gate with a gate length of no more than 1 µm in which a drain-side low dopant impurity concentration region that is effective in relaxing a high electric field is lengthened and the source-side low dopant impurity concentration region that reduces device performance is shortened. According to the method described in the publication, ion implantation producing the source region is performed employing the same mask as that employed in producing the source-side low concentration region, causing variations in the size of the source-side low concentration region that is actually obtained, resulting in low manufacturing precision. In addition, the dopant impurity concentration in the source-side region is higher than in the drain-side low dopant concentration region so that the gate overlapping capacitance is large and the source-drain breakdown voltage is insufficient.

SUMMARY OF THE INVENTION

It is an object of the present invention to provide a field effect transistor that can suppress a reduction in the breakdown voltage as well as variations in the threshold voltage even when gate length is shortened, thereby realizing high frequency operation and increased breakdown voltage.

It is another object of the present invention to provide an improved method for producing the field effect transistor described above.

It is still another object of the present invention to provide an improved method for producing a field effect transistor that provides a sufficient source-drain breakdown voltage even when a source-side low dopant impurity concentration region is shorter than a drain-side low dopant concentration region.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

According to a first aspect of the present invention, a field effect transistor includes a source-side high dopant impurity concentration region having a different conductivity type from that of a substrate and disposed at a source-side of a gate electrode and a dopant impurity region having the same conductivity type as that of the substrate and a higher dopant impurity concentration than the substrate below and surrounding the source-side high dopant impurity concentration region. Because the source-side high dopant impurity concentration region having a different conductivity type from that of the substrate is produced at the source side of the gate electrode, the ON-resistance of the transistor is reduced. Further, since the dopant impurity region has the same conductivity type as the substrate, a higher dopant impurity concentration than the substrate, and is located below and surrounding the source-side region, an improvement in the drain-source breakdown voltage, suppression of variations in the threshold voltage, and reductions in the gate-source capacitance and the gate-drain capacitance are obtained.

According to a second aspect of the present invention, a field effect transistor includes a source-side low dopant impurity concentration region having a shorter length than the length from the center of the gate electrode to a drain-side dopant impurity region and a dopant impurity region having the same conductivity type as that of the substrate and a higher dopant impurity concentration than the substrate below and surrounding the source-side low dopant impurity concentration region and the source-side high dopant impurity concentration region. By increasing the spacing between the gate electrode edge and the drain-side region, the depletion region extends to the drain-side when a reverse direction voltage is applied between the drain and the source, relaxing the electric field strength as well as raising the breakdown voltage. In addition, because the dopant impurity region having the same conductivity type as that of the substrate and a higher dopant impurity concentration than the substrate is located below the source-side low dopant impurity concentration region and the source-side high dopant impurity concentration region, surrounding both, an improvement in the drain-source breakdown voltage, suppression of variations in the threshold voltage, and reductions in the gate-source capacitance and the gate-drain capacitance can be attained.

According to a third aspect of the present invention, a method of producing a field effect transistor includes producing source and drain side dopant impurity regions by masking prescribed parts of source and drain side low dopant impurity concentration regions employing a photoresist. Therefore, an increase in the dopant impurity concentration of the low dopant impurity concentration can be suppressed.

According to a fourth aspect of the present invention, a method of producing a field effect transistor includes producing source and drain side dopant impurity regions by masking a prescribed part of the source-side low dopant impurity concentration region with a side wall. Therefore, the low dopant impurity concentration region can be produced self-aligningly and an increase in the dopant impurity concentration of this region can be suppressed.

DETAILED DESCRIPTION OF PREFERRED EMBODIMENTS

EMBODIMENT 1

Figure 1:
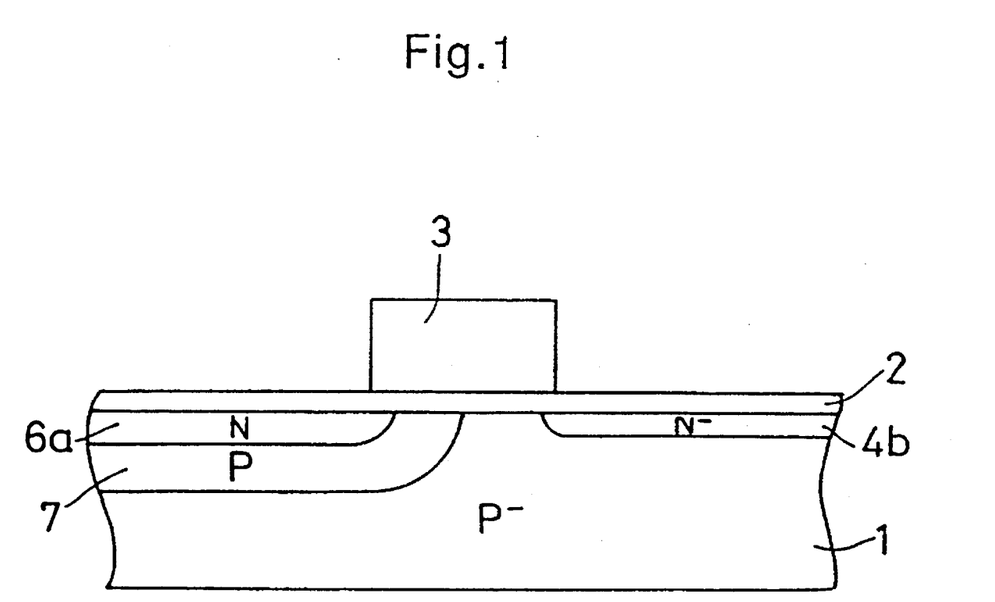
FIG. 1 is a schematic cross-sectional view illustrating a MOSFET in accordance with a first embodiment of the present invention.

FIG. 1 is a diagram illustrating a MOSFET according to a first embodiment of the present invention. In FIG. 1, reference numeral 1 designates a P$^-$-type semiconductor substrate having a resistivity of 1 to 10Ω cm. A gate oxide film 2 is disposed on the P$^-$-type semiconductor substrate 1. A gate electrode 3 comprising a refractory metal or polycrystalline silicon is disposed on the gate oxide film 2. Reference numeral 4b designates a drain-side N$^-$-type region produced by implanting a dopant impurity, such as phosphorus or arsenic, at a dosage of $10^{11}$ to $10^{13}$/cm$^2$, employing the gate electrode 3 as a mask. Reference numeral 6a designates a source-side N-type region produced by implanting a dopant impurity, such as phosphorus or arsenic, at a dosage of $10^{13}$ to $10^{14}$/cm$^2$, employing a photoresist mask covering the drain-side part. Reference numeral 7 designates a P-type region produced by rotational implantation with an inclination angle between the substrate and angle of incidence of a dopant impurity, such as boron, at a dosage of $10^{11}$ to $10^{12}$/cm$^2$.

Figures 2A, 2B, 2C:
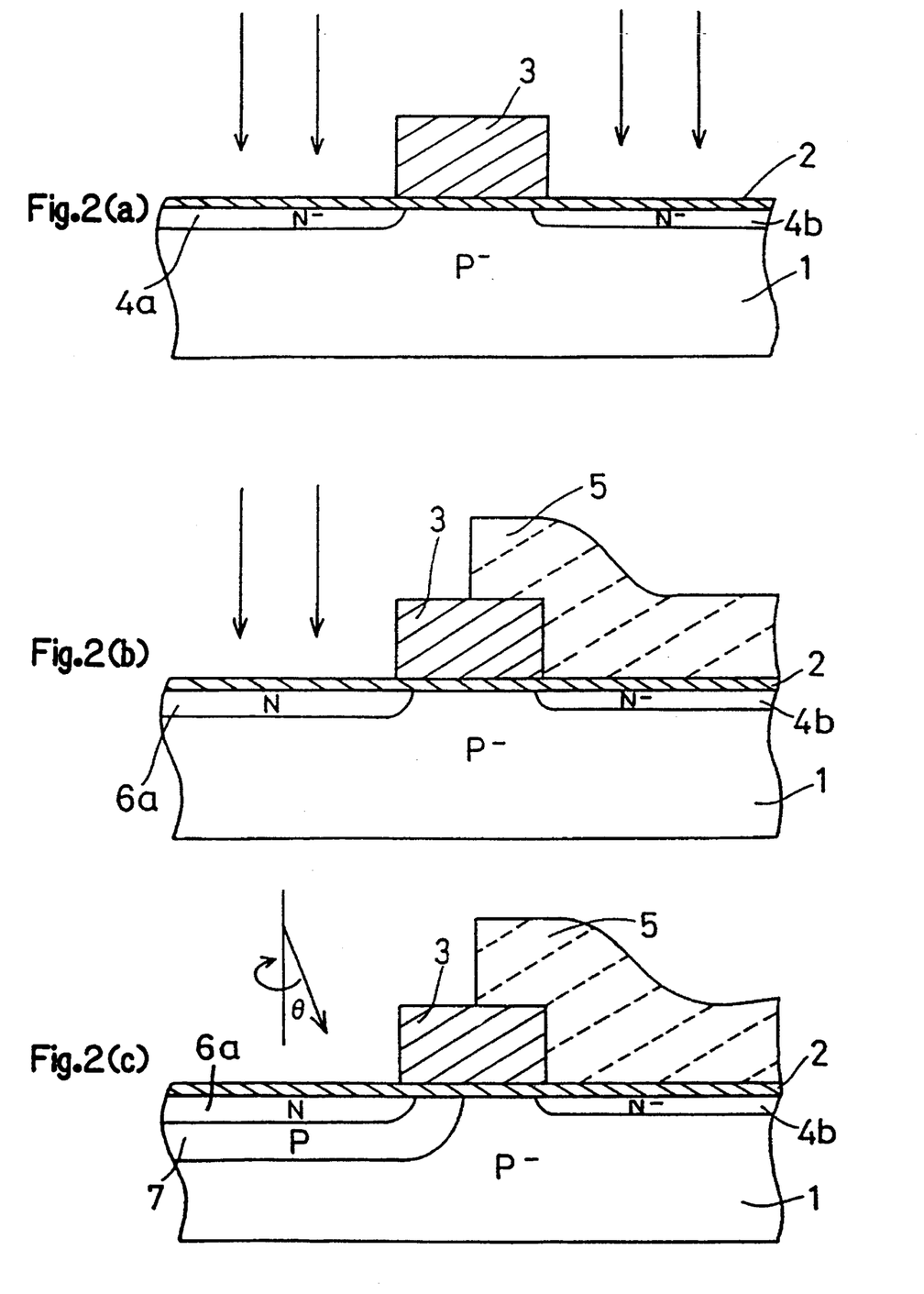
FIGS. 2(a)–2(c) illustrate a method of producing the MOSFET described above.

As shown in FIG. 2(a), the gate oxide film 2 is produced on the P$^-$-type semiconductor substrate 1 by thermal oxidation or the like to a thickness of 40 to 100 nanometers. A refractory metal film or a polycrystalline silicon film is formed on the gate oxide film to a thickness of 200 to 500 nanometers, producing the gate electrode 3 with an approximately 1 μm gate length. Subsequently, the drain-side N$^-$-type region 4b is produced by implanting a dopant impurity, such as phosphorus or arsenic, at a dosage of $10^{11}$ to $10^{13}$/cm$^2$, employing the gate electrode 3 as a mask.

Next, as shown in FIG. 2(b), a photoresist mask 5 is produced covering the drain-side electrode with an aperture at the source-side electrode having a boundary at the gate electrode 3. Then, ion implantation is carried out employing a portion of the gate electrode 3 that is exposed at the source-side electrode and not covered by the photoresist mask 5. The ion implantation is performed with the source end portion of the gate electrode 3 as a boundary. According to this method, the source-side high dopant impurity concentration N-type region 6a is produced by implanting a dopant impurity, such as phosphorus or arsenic, at a dosage of $10^{13}$ to $10^{14}$/cm$^2$, in the source electrode portion.

Further, as shown in FIG. 2(c), the P-type diffusion layer 7 is produced by rotational implantation, at an inclination angle, of a dopant impurity, such as boron, at a dosage of $10^{11}$ to $10^{12}$/cm$^2$, employing the photoresist mask 5 as an implantation mask.

Because the source-side N-type region 6a has a high dopant impurity concentration, the source parasitic resistance of the FET in this embodiment is reduced and the ON-resistance is reduced by that amount, realizing low voltage operation. In addition, when a reverse direction voltage is applied between the drain and the source, the depletion region directly below the gate electrode 3 does not extend because of the presence of the source-side P-type region 7 which has a higher dopant impurity concentration than the substrate 1, thereby suppressing punch-through breakdown caused by the short channel effect and improving the drain-source breakdown voltage. When the P-type dopant impurity concentration directly below the gate electrode 3 is raised because of the source-side P-type region 7, the drain-side P-type dopant impurity concentration directly below the gate electrode 3 is equal to the dopant impurity concentration of the P$^-$-type semiconductor substrate 1. Therefore, even when the concentration of the P$^-$-type semiconductor substrate 1 is reduced to improve the mobility of electrons, a reduction in the threshold voltage does not occur because the P-type high dopant impurity concentration region exists, as described above. Further, because the source-side P-type region 7 is located at the periphery and below the source-side N-type region 6a and directly below the gate electrode 3, the overlapping portion of the source-side N-type region 6a and the gate electrode 3 is reduced whereby the gate-source capacitance is reduced, improving the cutoff frequency which is inversely related to the gate-source capacitance.

EMBODIMENT 2

Figure 3:
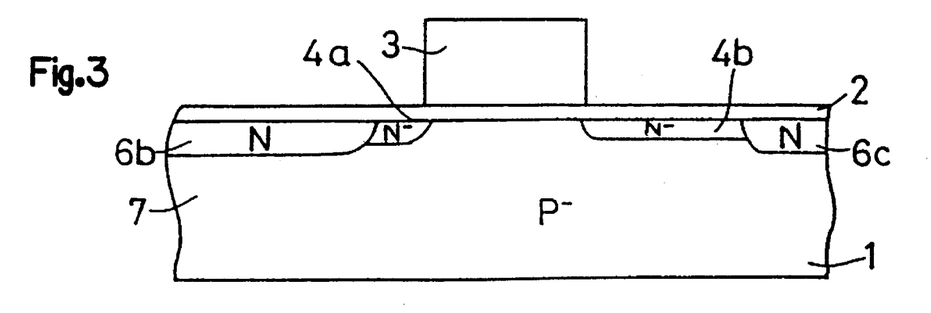
FIG. 3 is a schematic cross-sectional view illustrating a MOSFET in accordance with a second embodiment of the present invention.

FIG. 3 is a diagram illustrating a MOSFET according to a second embodiment of the present invention. In FIG. 3, reference numerals 6b and 6c respectively designate a source-side N-type region and a drain-side N-type region, both produced by, after producing a source-side N$^-$-type region 4a and a drain-side N$^-$-type region 4b, implanting ions employing a photoresist that covers the source and drain regions, respectively, as a mask.

Figures 4A, 4B:
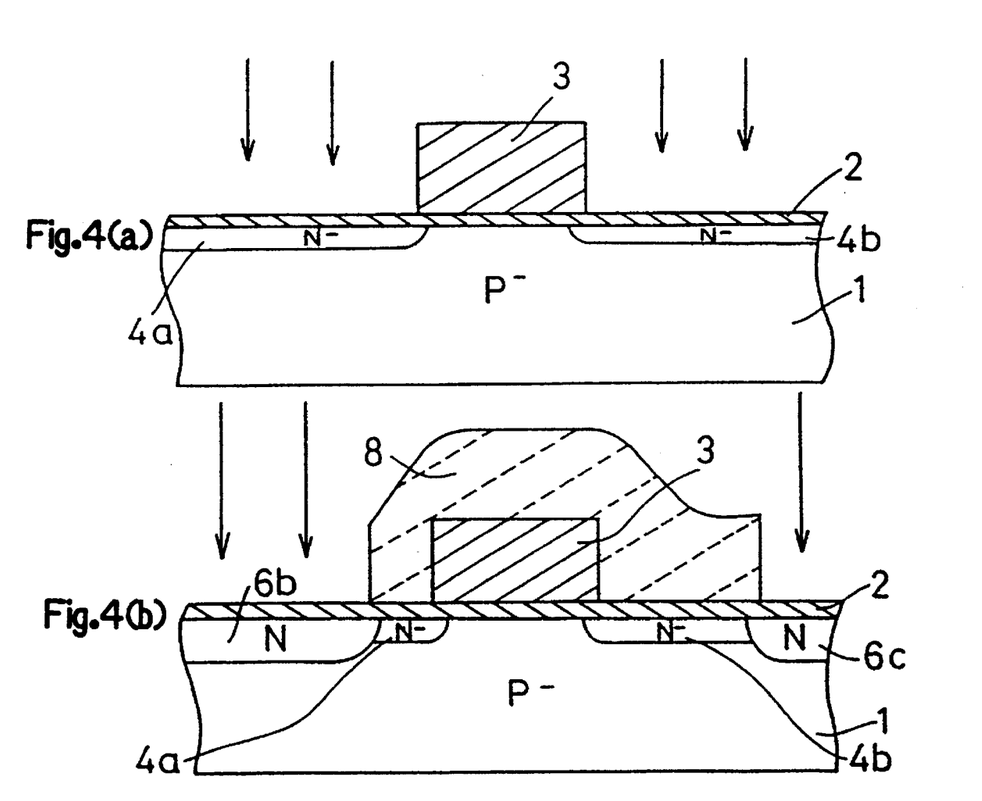
FIGS. 4(a) and 4(b) illustrate a method of producing the MOSFET described above.

In the process of FIG. 4(a), illustrating the same process as FIG. 2(a), the source-side N$^-$-type region 4a and the drain-side N$^-$-type region 4b are produced by implanting a dopant impurity, such as phosphorus or arsenic, employing the gate electrode 3 as a mask.

Subsequently, as shown in FIG. 4(b), a photoresist mask 8 that covers the gate electrode 3 and portions of the source-side N$^-$-type region 4a and the drain-side N$^-$-type region 4b is produced. The covered width of the source-side N$^-$-type region 4a is less than 1 μm and the covered width of the drain-side N$^-$-type region 4b is approximately 2 μm. The source-side N$^-$-type region 4a is intended to reduce the gate-source capacitance by narrowing the overlapping portion of the gate electrode 3 and the region 4a of the final product as much as possible, thereby increasing the cutoff frequency. If the width of the N$^-$-type region 4a covered by the photoresist mask 8 increases, the source resistance unfavorably increases, deteriorating high frequency characteristics. On the other hand, the drain-side N$^-$-type region 4b is intended to relax the electric field at the gate electrode 4 edge at the drain-side N$^-$-type region 4b due to the depletion region that is generated when a reverse voltage is applied between the drain electrode and the source electrode (not shown in the figure). The depletion region extends not only directly below the gate electrode 3 but also to the vicinity of the drain-side N$^-$-type region 4b. Accordingly, the drain-side N$^-$-type region 6c is produced at a position with an appropriate spacing, i.e., a spacing corresponding to the length of the drain-side N$^-$-type region 4b, from the gate electrode 3.

Then, the source-side N⁻-type region 6b and the drain-side N⁻-type region 6c are produced by implanting a dopant impurity, such as phosphorus or arsenic, to a high concentration employing the photoresist 8 as a mask. These N-type regions 6b and 6c reduce the ON-resistance.

According to this second embodiment, because the source and drain side N⁻-type regions 4a and 4b are produced by implanting a dopant impurity employing the gate electrode 3 as a mask and the source and drain side N-type regions 6b and 6c are produced employing the photoresist mask 8, the N⁻-type region 4a at the source electrode side relative to the gate electrode 3 can be shorter than the N⁻-type region 4b at the drain electrode side without increasing the dopant concentration of the source region side N⁻-type region 4a. Thus, the overlap of the gate electrode 3 and the N-type region 6b is reliably reduced, reducing the gate-source capacitance. In addition, because the drain electrode side N⁻-type region 4b is longer than the source region side N⁻-type region 4a, the depletion region extends more to the drain side when a reverse direction voltage is applied between the drain and the source, improving the drain-source breakdown voltage.

EMBODIMENT 3

Figure 5:
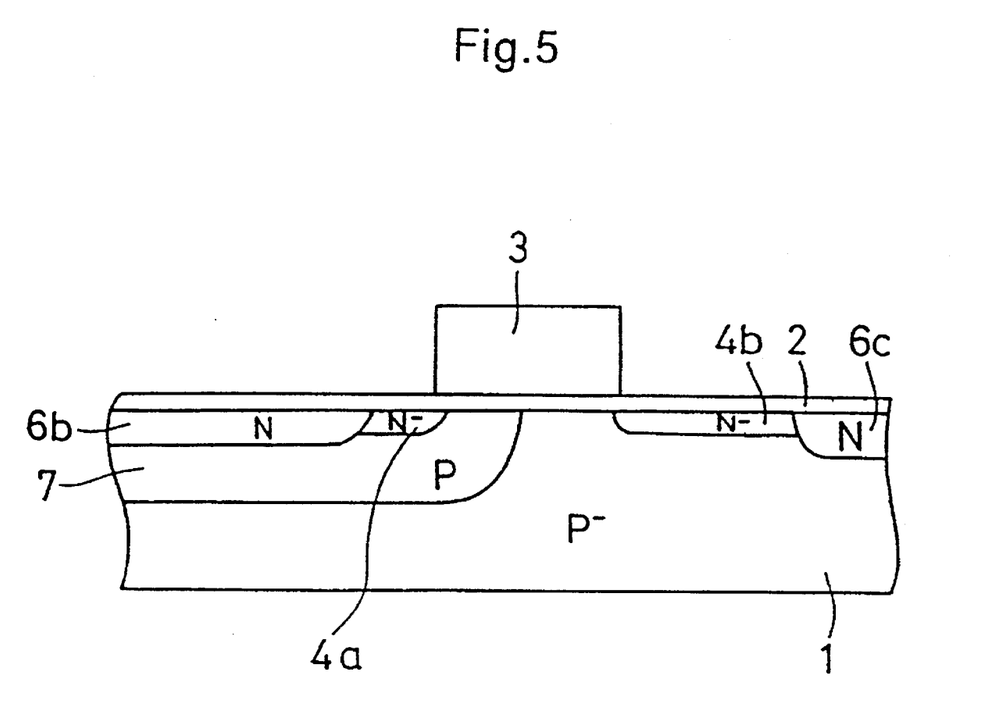
FIG. 5 is a schematic cross-sectional view illustrating a MOSFET in accordance with a third embodiment of the present invention.

FIG. 5 is a diagram illustrating a MOSFET according to a third embodiment of the present invention. In this third embodiment, in addition to the LDD structure of the second embodiment, a source-side P-type region 7 surrounding the N-type region 6b and the N⁻-type region 4a is provided at the source electrode side, as shown in FIG. 5.

Figure 6A:
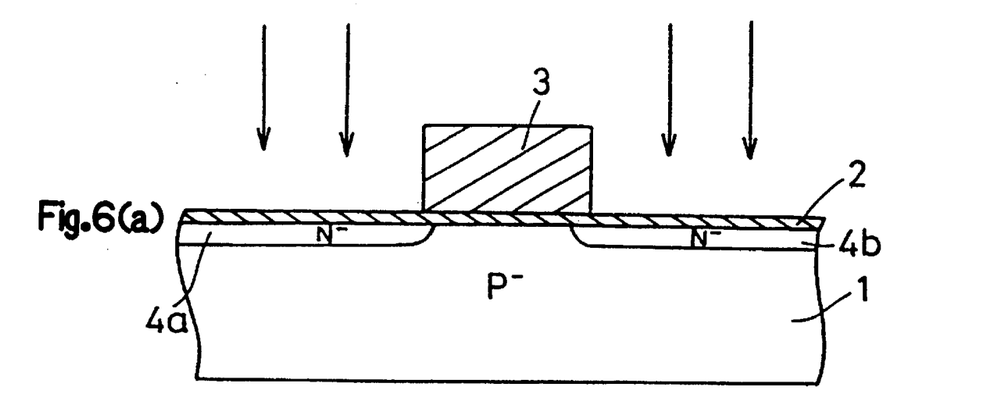
FIGS. 6(a)–6(c) illustrate a method of producing the MOSFET described above.

In the process of FIG. 6(a), illustrating the same process as FIG. 2(a), the source-side N⁻-type region 4a and the drain-side N⁻-type region 4b are produced by implanting a dopant impurity, such as phosphorus or arsenic, employing the gate electrode 3 as a mask.

Figure 6B:
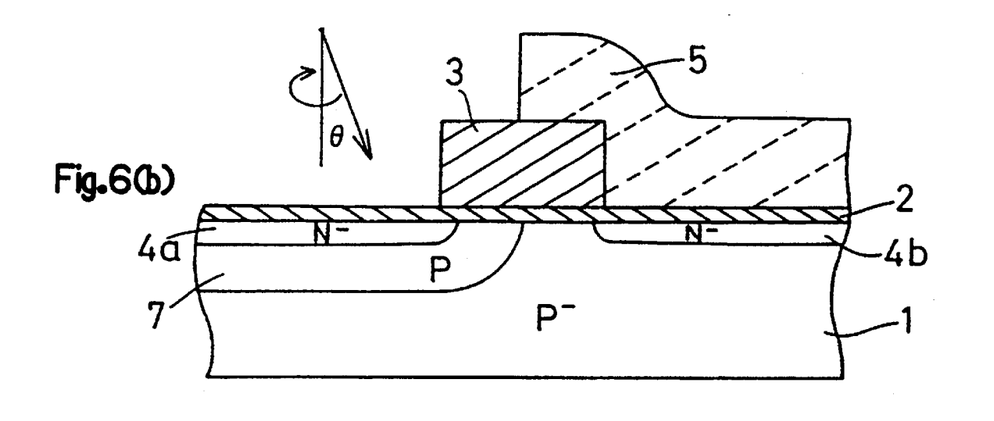

Subsequently, as shown in FIG. 6(b), the photoresist mask 5 having an aperture at the source electrode portion is produced and the source-side P-type region 7 is produced by rotational implantation of a dopant impurity, such as boron, at an inclination angle.

Figure 6C:
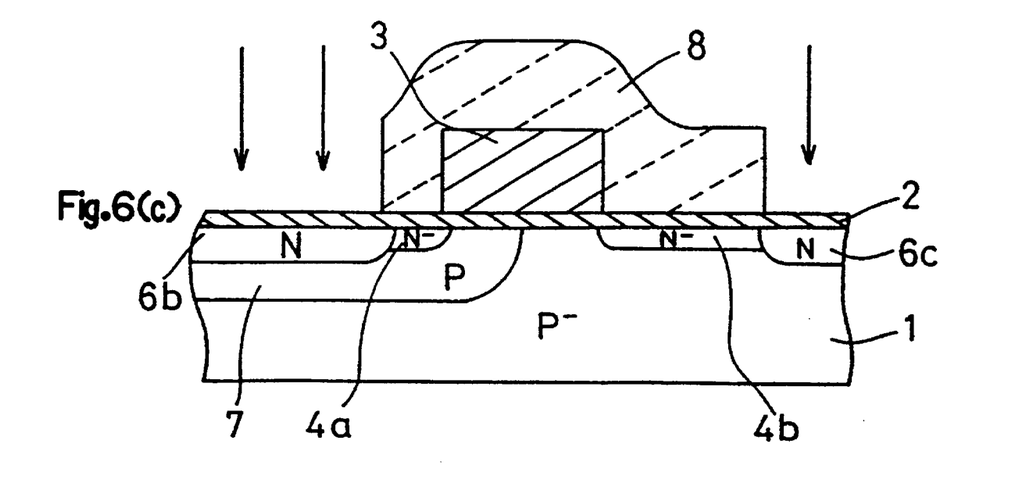

Then, as shown in FIG. 6(c), the photoresist mask 8 is produced and the source-side N-type region 6b and the drain-side N-type region 6c are produced by implanting a dopant impurity, such as phosphorus or arsenic, to a high concentration. The sizes of the source-side N⁻-type region 4 and the drain-side N⁻-type region 4b are similar to those produced according to the second embodiment.

Because the source-side N⁻-type region 4a is surrounded by the P-type region 7 having a higher dopant impurity concentration than the substrate 1, the overlap of the N⁻-type region 4a and the gate electrode 3 is reduced, reducing the gate-source capacitance, improving high frequency characteristics, and further suppressing punch-through and avalanche breakdown. Further, because the region 7 having a higher dopant impurity concentration than the substrate 1 exists between the source and the drain, variations in the threshold voltage due to the short channel effect are prevented. In addition, the gate-drain capacitance produced by overlapping of the drain-side N⁻-type region 4b and the gate electrode 3 is further reduced by widening the diffusion of the source-side P-type region 7 toward the drain side and lowering the dopant impurity concentration of the drain-side N⁻-type region 4b.

EMBODIMENT 4

Figure 7:
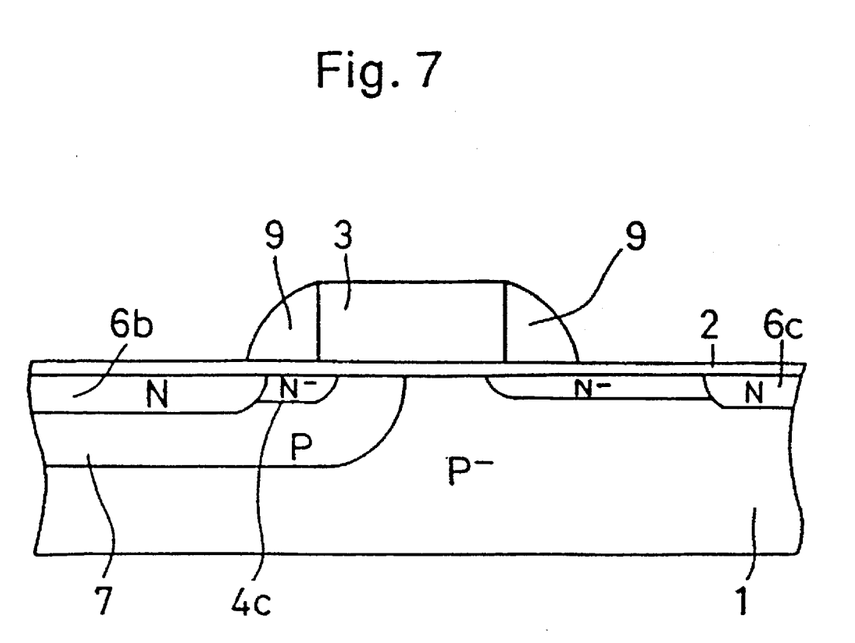
FIG. 7 is a schematic cross-sectional view illustrating a MOSFET in accordance with a fourth embodiment of the present invention.

FIG. 7 is a diagram illustrating a MOSFET according to a fourth embodiment of the present invention. In FIG. 7, reference numerals 9 designate side walls comprising an oxide film at the side walls of the gate electrode 3.

Figure 8A:
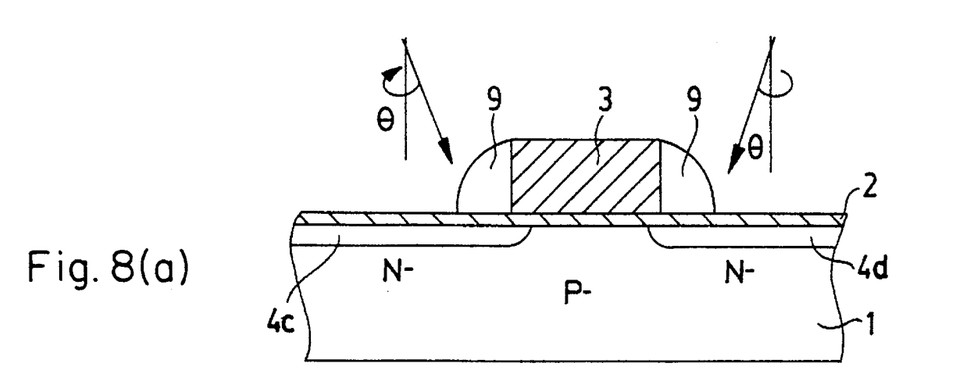
FIGS. 8(a)–8(c) illustrate a method of producing the MOSFET described above.

In the process of FIG. 8(a), illustrating the same process as FIG. 10(a), the source-side N⁻-type region 4c and the drain-side N⁻-type region 4d are produced by rotational implantation of a dopant impurity, such as phosphorus, at an inclination angle, employing the gate electrode 3 and the side walls 9 as a mask.

Figure 8B:
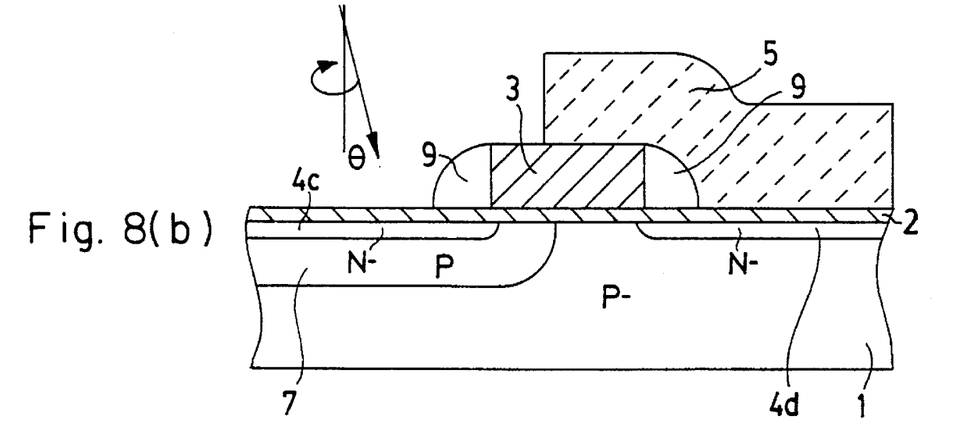

Subsequently, as shown in FIG. 8(b), the drain part covering photoresist mask 5 is produced and the source-side P-type region 7 is produced by rotational implantation of a dopant impurity, such as boron, at an inclination angle.

Figure 8C:
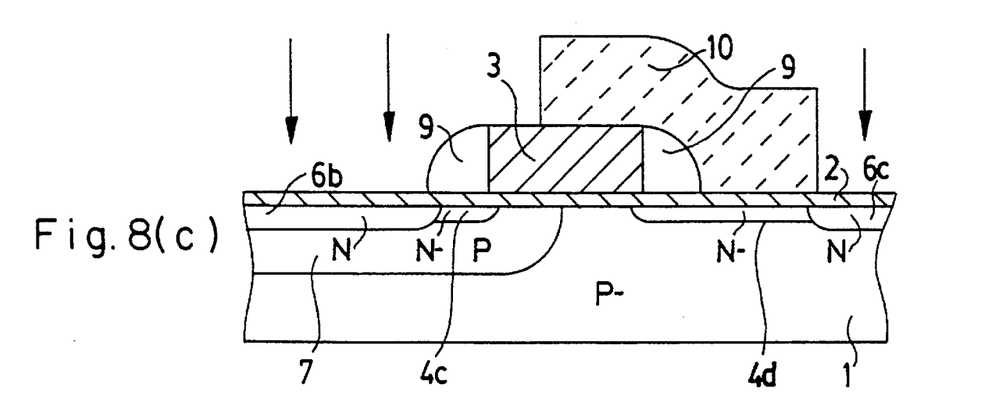

Further, as shown in FIG. 8(c), the source-side N-type region 6b and the drain-side N-type region 6c are produced by implanting a dopant impurity, such as phosphorus or arsenic, to a high concentration, employing the photoresist mask 10 that covers the N⁻-type region 4d at the drain side and has apertures at the source electrode and the drain electrode contact portions and a boundary opposite the gate electrode 3.

Using the production method described above, a MOSFET having the side walls 9 is produced and, due to the same structure as the third embodiment, an improvement in high frequency characteristics, an improvement in breakdown voltage, and stabilization of the threshold voltage are attained, as in the third embodiment. In addition, while producing the source and drain N-type regions 6b and 6c, the source-side N⁻-type region 4c can remain self-aligned with the side wall 9 that is provided at the source side of the gate electrode 3, thereby enabling higher manufacturing precision than when the photoresist is employed as a mask in the third embodiment.

According to the first embodiment of the present invention, because the source-side high dopant impurity concentration region of different conductivity type from the substrate is located at the source side of the gate electrode, the ON-resistance of the transistor is reduced. Further, due to the region of the same conductivity type as the substrate, below and surrounding the source-side dopant impurity region, an improvement in the drain-source breakdown voltage, suppression of the variations in the threshold voltage, and reductions in the gate-source capacitance and the gate-drain capacitance are attained.

According to the second embodiment of the present invention, by increasing the interval between the gate electrode end and the drain region, the depletion region extends to the drain side when a reverse direction voltage is applied between the drain and the source, relaxing the electric field strength as well as raising the breakdown voltage. In addition, because a dopant impurity region having the same conductivity type as the substrate and a higher dopant impurity concentration than the substrate is produced below the source-side low concentration region and the source-side region, surrounding both, an improvement in drain-source breakdown voltage, suppression of variations in the threshold voltage, and reductions in gate-source capacitance and gate-drain capacitance are attained.

According to the third embodiment of the present invention, the source and drain regions are produced by masking prescribed parts of the source and drain low dopant impurity concentration regions employing photoresist, thereby suppressing an increase in the dopant impurity concentration of these regions, precisely controlling the sizes of the regions, and reliably reducing the gate overlapping capacitance.

According to the fourth embodiment of the present invention, the source and drain regions are produced by masking a part of the source-side low dopant impurity concentration region employing a side wall, thereby suppressing an increase in the dopant impurity concentration of the region and controlling the size and location of the low dopant impurity concentration region with high precision by self-alignment.

What is claimed is:

1. A method for producing a field effect transistor including source and drain regions produced by implanting a dopant impurity employing a gate electrode as a mask comprising:

producing a gate electrode at a region on a first conductivity type semiconductor substrate having a first dopant impurity concentration;

implanting a dopant impurity producing a second conductivity type in said substrate employing said gate electrode as a mask, thereby producing source and drain regions having a second dopant impurity concentration;

producing a photoresist pattern on said substrate covering a drain electrode side of said substrate, but not covering a source electrode side of said substrate on the opposite side of said gate electrode from said drain electrode side, and implanting a dopant impurity producing the second conductivity type in said substrate employing said photoresist pattern as an ion implantation mask, thereby converting said source region from the second dopant impurity concentration to a third dopant impurity concentration higher than the second dopant impurity concentration; and diagonally rotatingly implanting in said substrate a dopant impurity producing the first conductivity type employing said photoresist pattern as an ion implantation mask, thereby producing a first conductivity type region with a higher dopant impurity concentration than the first dopant impurity concentration in said substrate and surrounding said source region.

2. A method for producing a field effect transistor including source and drain regions produced by implanting a dopant impurity employing a gate electrode as a mask comprising:

producing a gate electrode at a region on a first conductivity type semiconductor substrate;

producing source and drain side regions in said substrate and having a first dopant impurity concentration by implanting in said substrate a dopant impurity producing a second conductivity type in said substrate, employing said gate electrode as a mask; and producing a photoresist pattern on said substrate covering said gate electrode, only part of said source region, and only part of said drain region, the photoresist pattern covering a wider part of said drain region than of said source region, and implanting in said substrate a dopant impurity producing the second conductivity type in said substrate, employing the photoresist pattern as a mask, thereby producing regions at the source and drain sides having dopant impurity concentrations higher than the first concentration.

3. A method for producing a field effect transistor including source and drain regions produced by implanting a dopant impurity employing a gate electrode as a mask comprising:

producing a gate electrode at a region on a first conductivity type semiconductor substrate having a first dopant impurity concentration;

implanting in said substrate a dopant impurity producing a second conductivity type in said substrate, employing said gate electrode as a mask, thereby producing source and drain regions having a second dopant impurity concentration;

producing a first photoresist pattern on said substrate covering a drain electrode side of said substrate and having an aperture at a source electrode side of said substrate on the opposite side of said gate electrode from the drain electrode side and implanting in said substrate a dopant impurity producing the first conductivity type in said substrate, employing the first photoresist pattern as a mask, thereby producing a first conductivity type region having a third dopant impurity concentration, higher than the first dopant impurity concentration, surrounding said source region;

removing said first photoresist pattern; and producing a second photoresist pattern on said substrate covering said gate electrode, only part of said source region, and only part of said drain region, the second photoresist pattern covering a wider part of said drain region than of said source region and implanting in said substrate a dopant impurity producing the second conductivity type in said substrate, employing the second photoresist pattern as a mask, thereby increasing the dopant impurity concentration of parts of said source and drain regions.

4. A method for producing a field effect transistor including source and drain regions produced by implanting a dopant impurity employing a gate electrode as a mask comprising:

producing a gate electrode at a region on a first conductivity type semiconductor substrate having a first dopant impurity concentration;

producing insulating side wall films at opposite sides of and contacting said gate electrode;

diagonally rotatingly implanting in said substrate a dopant impurity producing the second conductivity type in said substrate, employing said gate electrode as a mask, thereby producing source and drain regions having a second dopant impurity concentration;

producing a first photoresist pattern on said substrate covering said drain region and having an aperture at said source region and implanting in said substrate a dopant impurity producing the first conductivity type in said substrate, employing the first photoresist pattern as a mask, thereby producing a first conductivity type region having a third dopant impurity concentration, higher than the first dopant impurity concentration, surrounding said source region;

removing said first photoresist pattern; and producing a second photoresist pattern on said substrate covering part of said gate electrode, one of said side wall films, and part of said drain region and not covering said source region, and implanting in said substrate a dopant impurity producing a second conductivity type region in said substrate, employing the second photoresist pattern as a mask, thereby increasing the dopant impurity concentrations of parts of said source and drain regions.

* * * * *